US008857041B2

(12) United States Patent
Masaki et al.

(10) Patent No.: US 8,857,041 B2
(45) Date of Patent: Oct. 14, 2014

(54) METHOD FOR FABRICATING AN ELECTROMECHANICAL TRANSDUCER

(75) Inventors: Yuichi Masaki, Kawasaki (JP); Yoshihiro Hasegawa, Tama (JP)

(73) Assignee: Canon Kabushiki Kaisha, Tokyo (JP)

( * ) Notice: Subject to any disclaimer, the term of this patent is extended or adjusted under 35 U.S.C. 154(b) by 722 days.

(21) Appl. No.: 13/087,178

(22) Filed: Apr. 14, 2011

(65) Prior Publication Data

US 2011/0260576 A1    Oct. 27, 2011

(30) Foreign Application Priority Data

Apr. 23, 2010 (JP) ................................. 2010-099319
Feb. 24, 2011 (JP) ................................. 2011-037773

(51) Int. Cl.
*G01R 3/00* (2006.01)
*H04R 31/00* (2006.01)
*H04R 19/00* (2006.01)

(52) U.S. Cl.
CPC .............. *H04R 19/005* (2013.01); *H04R 31/00* (2013.01)
USPC ............. 29/595; 29/592.1; 29/594; 29/609.1; 310/344; 310/345; 310/346; 438/50; 438/53

(58) Field of Classification Search
USPC ............. 29/592.1, 594, 595, 609.1, 831, 846; 310/300, 330–332, 340, 344, 345; 333/186–189
See application file for complete search history.

(56) References Cited

U.S. PATENT DOCUMENTS

| 4,849,071 | A | * | 7/1989 | Evans et al. ...................... 438/53 |
| 4,853,669 | A | * | 8/1989 | Guckel et al. ...................... 338/4 |
| 5,510,276 | A | * | 4/1996 | Diem et al. ....................... 438/53 |
| 5,912,499 | A | * | 6/1999 | Diem et al. ..................... 257/419 |
| 7,673,375 | B2 | * | 3/2010 | Chang et al. .................. 29/25.42 |
| 2010/0123366 | A1 | * | 5/2010 | Chang ........................... 310/300 |

OTHER PUBLICATIONS

U.S. Appl. No. 13/141,488, filed Jun. 22, 2011, Yoshitaka Zaitsu.
U.S. Appl. No. 13/025,869, filed Feb. 11, 2011, Kazunari Fujii.
U.S. Appl. No. 13/012,699, filed Jan. 24, 2011, Atsushi Kandori.
U.S. Appl. No. 13/114,567, filed May 24, 2011, Yoshihiro Hasegawa.
U.S. Appl. No. 13/050,758, filed Mar. 17, 2011, Atsushi Kandori.

* cited by examiner

*Primary Examiner* — Paul D Kim
(74) *Attorney, Agent, or Firm* — Canon USA, Inc. IP Division

(57) ABSTRACT

An electromechanical transducer includes a first electromagnetic element and a second electromagnetic element, such as electrodes, disposed opposite to each other with a sealed cavity therebetween. The sealed cavity is formed by removing a sacrifice layer and then performing sealing. A sealing portion is formed by superposing a film of a hardened second sealing material that has fluidity at normal temperature on a film of a first sealing material that does not have fluidity at normal temperature.

8 Claims, 7 Drawing Sheets

METHOD FOR FABRICATING AN ELECTROMECHANICAL TRANSDUCER

BACKGROUND OF THE INVENTION

1. Field of the Invention

The present invention relates to an electromechanical transducer, such as a capacitive ultrasonic transducer, and a method for fabricating the same.

2. Description of the Related Art

In recent years, a capacitive electromechanical transducer fabricated using a micromachining process has been researched. A normal capacitive electromechanical transducer has a vibrating membrane supported at a distance from a lower electrode, and an upper electrode disposed on the surface of the vibrating membrane. This is used, for example, as a capacitive micromachined ultrasonic transducer (CMUT). A CMUT transmits or receives ultrasound using a light-weight membrane. It is easy to obtain a CMUT that has excellent broadband characteristics in both liquid and air. Use of this CMUT enables more accurate diagnosis than conventional medical diagnosis. Therefore, it is attracting attention as a promising technology. The operating principle of a CMUT will be described. When transmitting ultrasound, a DC voltage overlapped with an AC voltage is applied between the lower electrode and the upper electrode. This causes the vibrating membrane to vibrate, thereby generating ultrasound. When receiving ultrasound, the vibrating membrane is deformed by ultrasound, and the deformation causes a change in the capacitance between the lower electrode and the upper electrode. Therefore, the displacement of the vibrating membrane can be detected as an electric signal.

A method called "surface type" is used as a method for forming the "gap" (the distance between the electrodes) of a CMUT. It includes providing a sacrifice layer having a thickness equal to the distance between the electrodes, forming a vibrating membrane on the sacrifice layer, removing the sacrifice layer by etching, and sealing the etching hole. It is proposed to seal the etching hole with a SiN film formed by plasma-enhanced (PE) CVD or a $SiO_2$ film formed by low-pressure (LP) CVD in view of the size of the etching hole (see IEEE Transactions On Ultrasonic, Ferroelectrics, And Frequency Control, Vol. 52, No. 12, December 2005, pp. 2242-2258). It is also proposed to seal the etching hole with metal (see U.S. Pat. No. 4,262,399).

The above-described surface-type CMUT has many sealing portions on the surface of the substrate, and therefore a sealing method is required by which the many sealing portions can be sealed collectively and tightly. Although a thin film can be formed by vacuum film formation, it is difficult to completely seal the vertical hole structure of the etching hole in the surface of the vibrating membrane with a deposited film formed by gas phase reaction in a vacuum atmosphere, for example, by CVD or PVD. When the etching hole in the vibrating membrane is sealed by CVD or the like, a deposited film is formed on the side wall defining the hole or a part of the vibrating membrane around the etching hole, and this film grows toward the center of the hole (deposition progresses in the lateral direction). However, in general, in gas phase reaction, active species (ions, radicals, or the like) that form a deposited film tend to travel in a straight line, and the deposition rate in the lateral direction is low. Therefore, it is necessary to increase the film thickness by prolonged film formation. If there is a minute sealing defect in the wet step after the sealing step, the solution used for developing and removing photoresist may enter the cavity and cause a malfunction. On the other hand, when a resin material that has fluidity is used for sealing, the vertical hole structure can be tightly sealed due to fluidity. However, in the process of hardening, the solvent in the material that has fluidity may contaminate the cavity by being heated, or the material may become temporarily less viscous due to high temperature and may flow into parts that need not be sealed, and the function of the device may thereby be interfered with. The present technical situation is as described above. For example, in medical diagnosis, CMUTs are normally used in contact with liquid such as castor oil in order to prevent attenuation of ultrasound that is a signal. If the reliability of the sealing portion is low, oil may enter the cavity in prolonged use, and the performance degradation may be caused.

SUMMARY OF THE INVENTION

In an aspect of the present invention, an electromechanical transducer includes a first electromagnetic element and a second electromagnetic element, disposed opposite to each other with a sealed cavity therebetween. The sealed cavity is formed by removing a sacrifice layer and then performing sealing. The performing sealing to form a sealing portion includes superposing a film of a hardened second sealing material that has fluidity at normal temperature on a film of a first sealing material that does not have fluidity at normal temperature.

In another aspect of the present invention, there is provided a method for fabricating an electromechanical transducer including a first electromagnetic element and a second electromagnetic element, disposed opposite to each other with a sealed cavity therebetween. The method includes: forming a sacrifice layer on the first electromagnetic element and patterning the sacrifice layer; forming a vibrating membrane on the sacrifice layer; forming an etching hole in the vibrating membrane; etching the sacrifice layer through the etching hole and thereby forming the cavity; forming a film of a first sealing material that does not have fluidity at normal temperature on the vibrating membrane having the etching hole; forming a film of a second sealing material that has fluidity at normal temperature on the film of the first sealing material; hardening and patterning the film of the second sealing material; and etching the film of the first sealing material using the patterned film of the second sealing material as a mask and thereby forming a sealing portion that seals the cavity.

In another aspect of the present invention, there is provided a method for fabricating an electromechanical transducer including a first electromagnetic element and a second electromagnetic element disposed opposite to each other with a sealed cavity therebetween. The method includes: forming a sacrifice layer on the first electromagnetic element and patterning the sacrifice layer; forming a vibrating membrane on the sacrifice layer; forming the second electromagnetic element on the vibrating membrane; forming an etching hole in the vibrating membrane; etching the sacrifice layer through the etching hole and thereby forming the cavity; forming a film of a first sealing material that does not have fluidity at normal temperature on the vibrating membrane having the etching hole; forming a film of a second sealing material that has fluidity at normal temperature on the film of the first sealing material; and hardening the film of the second sealing material.

Further features of the present invention will become apparent from the following description of exemplary embodiments with reference to the attached drawings.

DESCRIPTION OF THE EMBODIMENTS

Figure 1A:
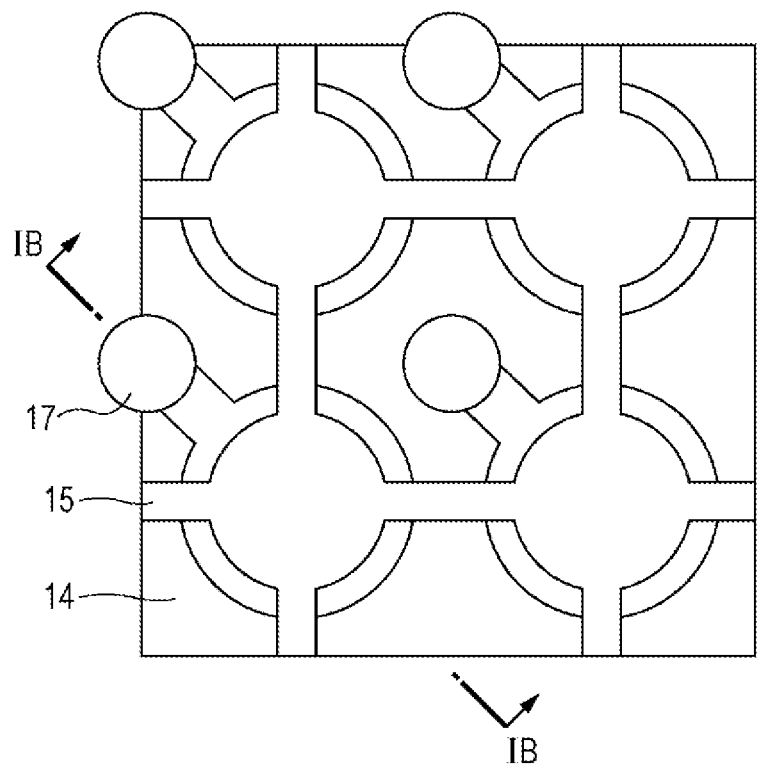
FIGS. 1A and 1B illustrate a first embodiment of the present invention.

The electromechanical transducers and methods for fabricating the same of the present invention are characterized in that a cavity formed after removing a sacrifice layer is sealed by forming a film of a second sealing material that has fluidity at normal temperature on a film of a first sealing material that does not have fluidity at normal temperature and then hardening the second sealing material. On the basis of this concept, the electromechanical transducers and methods for fabricating the same of the present invention basically have the above-described configuration. In this specification, the term "normal temperature" means temperatures of about 25° C.±15° C., which are the temperatures of the environment under which fabricating methods are performed. The term "a sealing material that does not have fluidity at normal temperature" means an inorganic material (in the present invention, inorganic materials include metal materials) that is formed into a film by CVD or PVD method and cannot flow in the state of a film. The term "fluidity" means the property not to fix but to flow or to change its shape. Examples of sealing materials that do not have fluidity at normal temperature include Si materials such as SiN, $SiO_2$, SiON, and a-Si, metal materials such as Al and Ti, and metal oxide materials such as $Al_2O_3$ that are deposited and formed into a film by CVD or PVD method. The term "a sealing material that has fluidity at normal temperature" means an organic material or an inorganic material that flows at normal temperature, that can be formed into a film, for example, by spin coat method, that can flow in the state of a film, and that has the property to react with external energy such as heat or light to harden after film formation. Examples of sealing materials that have fluidity at normal temperature include materials that lose fluidity by being heated, such as polyimide resin, silicone resin, photoresist, and SOG (Spin On Glass), and materials that lose fluidity by being exposed to light, such as ThreeBond 3100 series. In the present invention, not only organic SOG but also inorganic SOG can be used as a material that has fluidity at normal temperature.

On the basis of this basic configuration, the following embodiments are possible. For example, an electromechanical transducer has a plurality of elements each including a plurality of cells. When an electromechanical transducer is a capacitive type as in the embodiments to be described later, the first electromagnetic element and the second electromagnetic element are electrodes. However, the present invention is not limited to a capacitive type, such as a CMUT, and can be applied to any electromechanical transducer as long as it has the same structure (the structure in which a first electromagnetic element and a second electromagnetic element are disposed with a sealed cavity therebetween). The present invention can be applied, for example, to a magnetic transducer (MMUT). In this case, the first electromagnetic element and the second electromagnetic element are, for example, magnetic bodies, such as magnets, or magnet coils. In the case of a capacitive type, a cell can include a first electrode disposed on a substrate, a second electrode disposed opposite to the first electrode with a cavity therebetween, a vibrating membrane supporting the second electrode, and a supporting portion supporting the vibrating membrane. When the vibrating membrane is formed of a conductive material such as a conductor or a semiconductor, the vibrating membrane can double as the second electrode. When the substrate is formed of a semiconductor such as silicon, the substrate can double as the first electrode. The above-described configuration makes it possible to provide a highly reliable electromechanical transducer in which a cavity is sufficiently sealed. Since a sealing portion is formed by sealing with a first sealing material that does not have fluidity at normal temperature and then applying a second sealing material that has fluidity at normal temperature and hardening this, an extremely highly reliable capacitive electromechanical transducer can be fabricated even if a minimum amount of first sealing material is used. Since the degree of freedom in designing the film configuration of the sealing portion increases, an electromechanical transducer can be adapted for many applications. Compared to the case where a hole is sealed only with a deposited film formed by CVD or the like, sealing can be performed in a short time, and the takt time can be shortened.

Although the present invention will be described in more detail by way of embodiments, the present invention is not limited by this at all.

First Embodiment

Figure 1B:
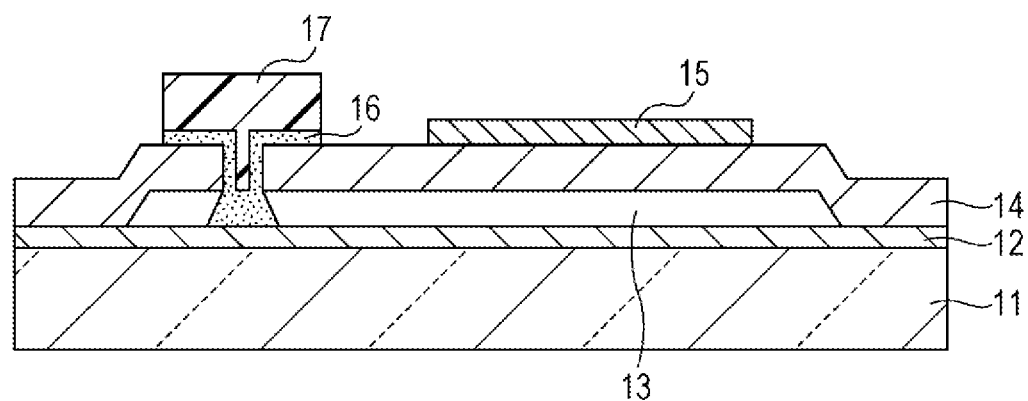

A description will be given of a first embodiment of the present invention relating to a capacitive electromechanical transducer and a method for fabricating the same. FIG. 1A is a plan view showing the basic structure of an electromechanical transducer of this embodiment. FIG. 1B is a sectional view taken along line IB-IB of FIG. 1A. The electromechanical transducer of this embodiment has a lower electrode 12, a vibrating membrane 14, and an upper electrode 15. The lower electrode 12 is a first electrode disposed on a substrate 11. The vibrating membrane 14 is disposed opposite to the lower electrode 12 with a sealed cavity 13 therebetween and is movably supported. The upper electrode 15 is a second electrode disposed on the upper surface of the vibrating membrane 14. The materials that seal the etching hole and thereby seal the cavity 13 include a first sealing material 16 and a second sealing material 17. In general, a capacitive electromechanical transducer is configured by arranging a plurality of elements. Each element includes a plurality of cells. Each cell includes a lower electrode 12, a vibrating membrane 14, and an upper electrode 15 surrounding a sealed cavity 13. Here, elements each consisting of four cells such as those shown in FIG. 1A are arranged two-dimensionally. The upper electrodes 15 are electrically connected by wiring, and the lower electrodes 12 are electrically independent on an element-by-element basis. Due to such a configuration, on an element-by-element basis, it is possible to apply a voltage between the lower electrode 12 and the upper electrode 15 to vibrate the vibrating membrane 14 to generate ultrasound. When receiving ultrasound, on an element-by-element basis, a signal can be detected from a change in the capacitance between the lower electrode and the upper electrode caused by the deformation of the vibrating membrane 14 due to ultrasound. In this embodiment, the cavity 13 is circular in cross-section as shown in FIG. 1A. However, the present invention is not limited to this. The cavity 13 may have a polygonal shape such as a quadrilateral shape. An etching hole is formed in a projecting etching channel connected to the cavity 13, and the etching hole is sealed with sealing materials 16 and 17. The place where an etching hole is formed is not limited to this. An etching hole can also be formed, for example, around the cavity 13.

In this embodiment, the height of the sealed cavity 13 is 200 nm, but it can be, for example, 10 nm to 500 nm. The diameter of the circular sealed cavity 13 can be, for example, 10 μm to 200 μm. The upper electrode 15 and the lower electrode 12 are formed of at least one of, for example, Al, Cr, Ti, Au, Pt, and Cu. The vibrating membrane 14 is formed of SiN but can be formed of another insulating material. The sealed cavity 13 is formed by removing a sacrifice layer 18 to be described later. At least one of Cr, Al, Si, and $SiO_2$ can be used as the material of the sacrifice layer 18. Other materials, such as organic materials, can also be used as the material of the sacrifice layer 18.

Figure 2A:
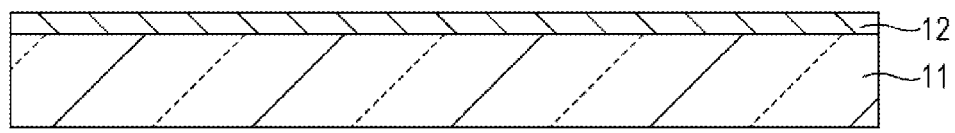
FIGS. 2A to 2D illustrate steps of a method for fabricating an electromechanical transducer in the first embodiment.

Next, a fabricating method of this embodiment will be described step-by-step with reference to FIGS. 2A to 2D, 3A to 3C, 4A to 4C, and 5A to 5D. In the step shown in FIG. 2A, a lower electrode 12 is formed of titanium by sputtering on a glass substrate 11. The substrate 11 may be formed of another material, for example, quartz, sapphire, or silicon. The conditions of this step can be as follows. After evacuation to $3\times10^{-5}$ Pa, film formation is performed for 200 seconds under the following conditions: Ar flow rate 30 sccm, pressure 0.7 Pa, and DC power 400 W. Thus, a titanium film about 100 nm thick is formed.

Figure 2B:
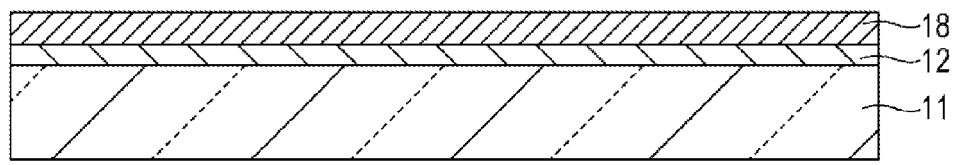
Figure 2C:
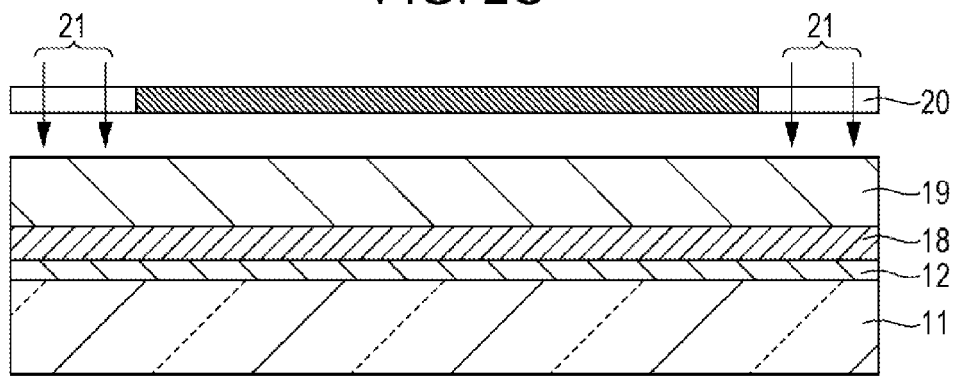

In the step shown in FIG. 2B, a sacrifice layer 18 is formed of chrome by sputtering on the lower electrode that is a first electromagnetic element. The conditions of this step can be as follows. After evacuation to $3\times10^{-5}$ Pa, film formation is performed for 500 seconds under the following conditions: Ar flow rate 50 sccm, pressure 0.9 Pa, and DC power 400 W. Thus, a chrome film about 200 nm thick is formed. In the step shown in FIG. 2C, photoresist 19 (AZ1500, Shipley) is applied using a spinner to a thickness of about 2 μm, and a pre-bake is performed at 110° C. for 90 seconds. After that, through a photomask 20 having a predetermined cavity pattern, ultraviolet irradiation 21 is performed using an aligner.

Figure 2D:
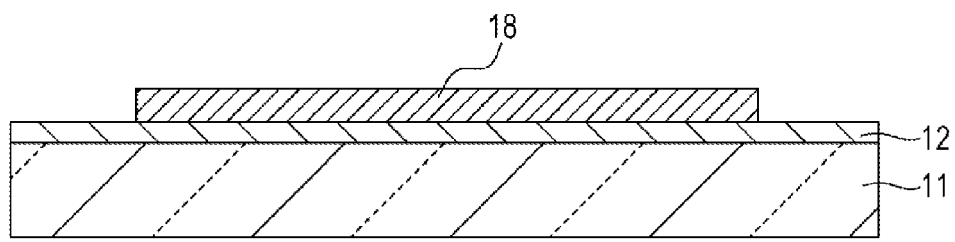

In the step shown in FIG. 2D, the resist film in which a pattern of a cavity having a diameter of 30 μm and an etching channel is formed by developer undergoes a post-bake at 180° C. for 3 minutes. After the post-bake, etching is performed with chrome etchant (mixed acid chrome etchant, KANTO CHEMICAL), and resist stripping, rinse, and drying are performed. Thus, a patterned sacrifice layer 18 is obtained.

Figure 3A:
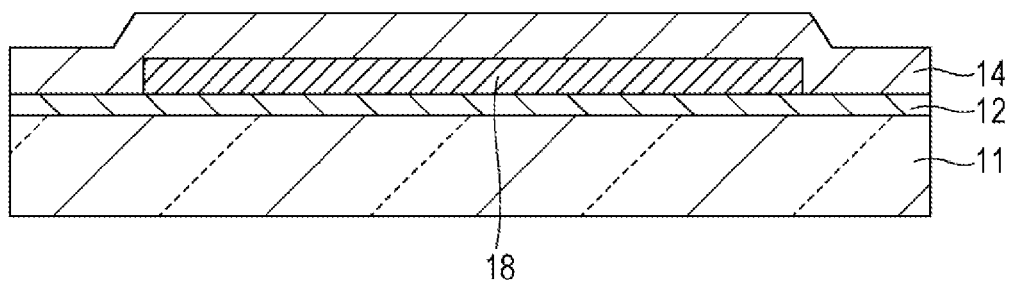
FIGS. 3A to 3C illustrate steps of the method for fabricating an electromechanical transducer in the first embodiment.
Figure 3B:
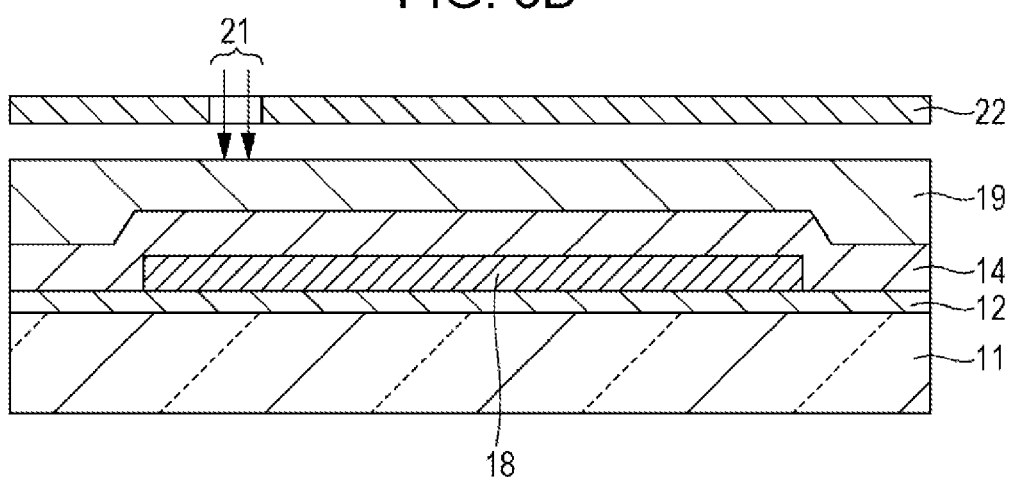
Figure 3C:
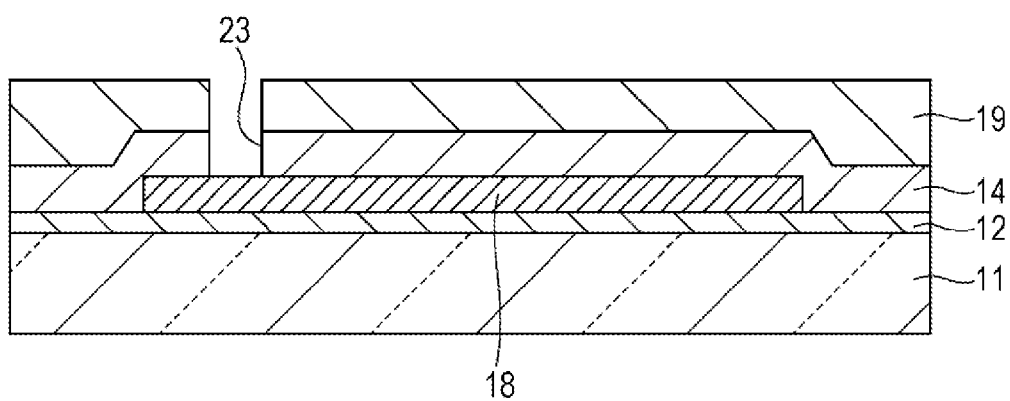

In the step shown in FIG. 3A, a vibrating membrane 14 is formed of silicon nitride by plasma CVD method on the sacrifice layer. The conditions of this step can be as follows. Film formation is performed for 20 minutes under the following conditions: substrate temperature 350° C., RF power 360 W, chamber pressure 150 Pa, $SiH_4$ gas flow rate of 24 sccm, $NH_3$ gas flow rate of 150 sccm, and $N_2$ gas flow rate of 600 sccm. Thus, a silicon nitride film about 450 nm thick is formed. In the step shown in FIG. 3B, photoresist 19 is applied using a spinner to a thickness of about 2 μm, and a pre-bake is performed at 90° C. for 90 seconds. After that, through a photomask 22 having a predetermined etching hole pattern, ultraviolet irradiation 21 is performed using an aligner. A pattern of an etching hole 23 having a diameter of 8 μm is formed by developer. A post-bake is performed at 120° C. for 3 minutes. In the step shown in FIG. 3C, silicon nitride 14 is etched by dry etching method and an etching hole 23 is formed. The conditions of this step can be as follows. After evacuation to $3\times10^{-5}$ Pa, etching is performed for 2 minutes under the following conditions: $CF_4$ gas flow rate of 20 sccm, pressure 5 Pa, and DC power 150 W. After that, the resist film 19 is removed by ultrasonic cleaning in acetone solution. Thus, the step of forming an etching hole in the vibrating membrane is completed.

Figure 4A:
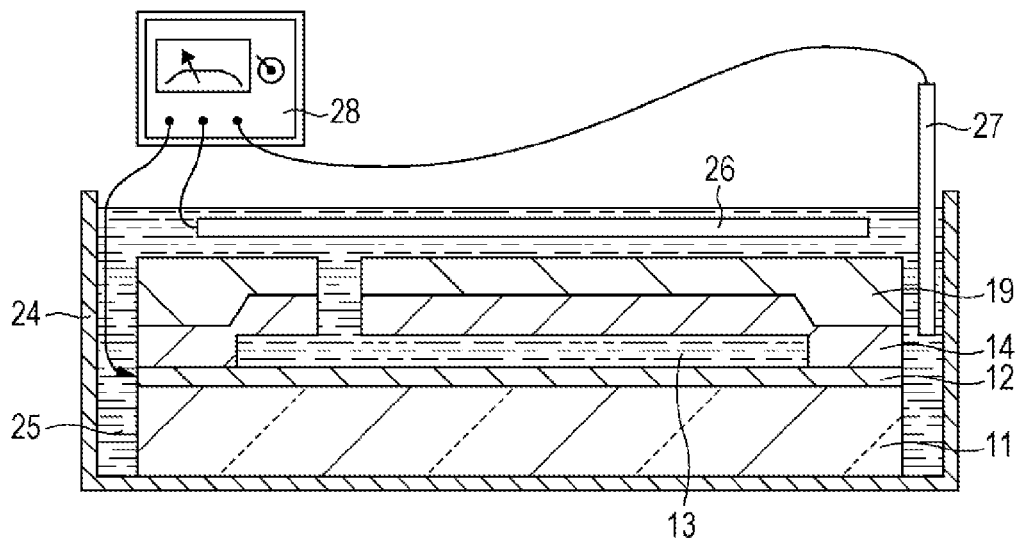
FIGS. 4A to 4C illustrate steps of the method for fabricating an electromechanical transducer in the first embodiment.

In the step shown in FIG. 4A, the chrome film 18 is removed as a sacrifice layer by electrolytic etching through the etching hole, and thereby a cavity 13 is formed. The conditions of this step can be as follows. An etching bath 24 is filled with two moles of sodium chloride solution 25. In the etching bath 24, a platinum opposite electrode 26 and a silver/silver chloride reference electrode 27 for monitoring the electrical potential are disposed. By applying a DC voltage of 2 V to the lower electrode 12 using a potentiostat 28, the chrome sacrifice layer 18 is etched in 500 seconds. After that, rinse and replacement of water with isopropyl alcohol are performed. Finally, drying is performed using a fluorochemical solvent (HFE7100, Sumitomo 3M).

Figure 4B:
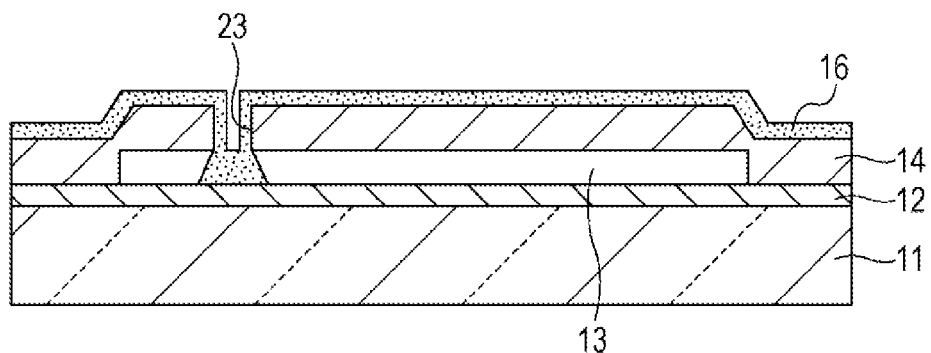
Figure 4C:
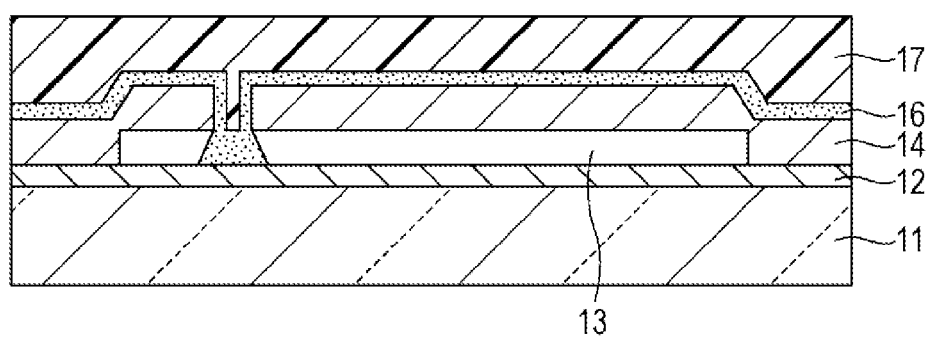
Figure 5A:
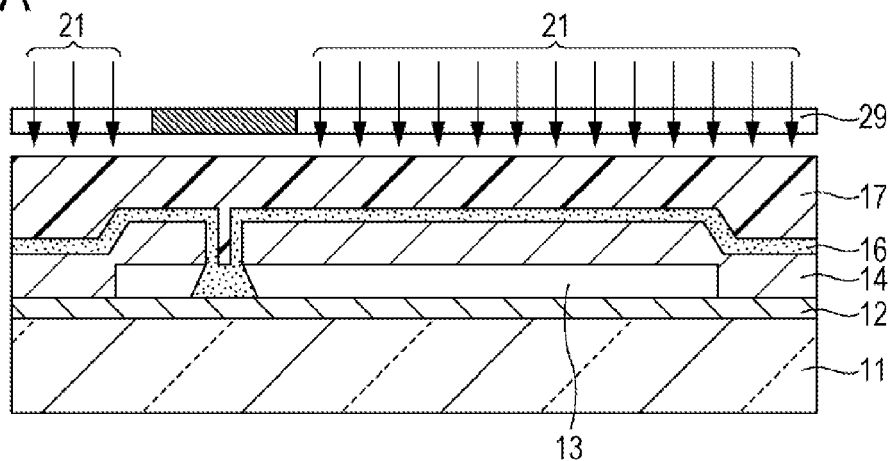
FIGS. 5A to 5D illustrate steps of the method for fabricating an electromechanical transducer in the first embodiment.
Figure 5B:
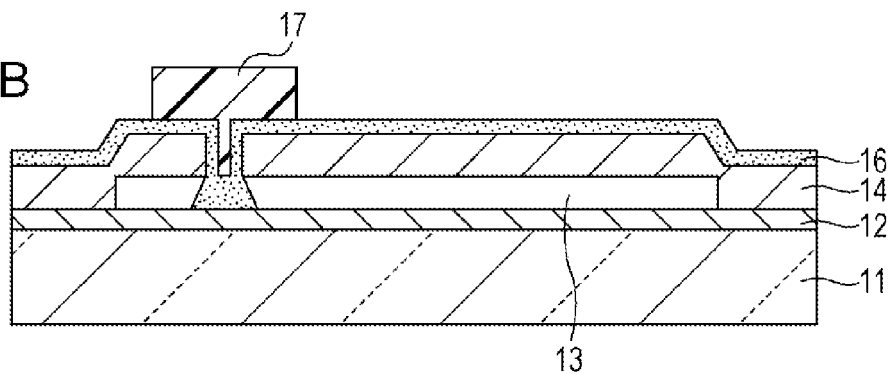

In the step shown in FIG. 4B, a film of a first sealing material (a sealing material that does not have fluidity at normal temperature) 16 is formed on the vibrating membrane having the etching hole to seal the etching hole. In this embodiment, the first sealing material 16 is $SiO_2$. The conditions of this step can be as follows. Film formation is performed for 3 minutes under the following conditions: substrate temperature 350° C., RF power 360 W, chamber pressure 150 Pa, $SiH_4$ gas flow rate of 40 sccm, and $N_2O$ gas flow rate of 80 sccm. Thus, an $SiO_2$ film 16 having a thickness of about 600 nm is formed. In the step shown in FIG. 4C, a film of a second sealing material that has fluidity at normal temperature is formed on the film of the first sealing material. In this embodiment, the second sealing material 17 for sealing the etching hole is photosensitive polyimide (PW-1210, Toray). However, commercially available photosensitive polyimides of other companies, such as Hitachi Chemical Company, Ltd. and Asahi Kasei Corporation, or other materials that have fluidity at normal temperature can also be used. The conditions of this step can be as follows. A drop of photosensitive polyimide solution is put near the center of the substrate. The substrate is spun using a spinner at 200 rpm for five seconds and then at 1800 rpm for 30 seconds to uniformly apply the photosensitive polyimide solution to the surface of the substrate. After that, the substrate is dried on a hot plate at 120° C. for three minutes. Thus, a polyimide film 17 is formed. In the step shown in FIG. 5A, ultraviolet exposure 21 is performed using an aligner through a photomask 29 having a sealing portion pattern at an intensity of 100 mJ/cm². After that, development is performed using 2.38% TMAH (Tetramethylammonium hydroxide) developer. Rinse is performed to complete patterning. In order to promote the imidization, firing is performed in a nitrogen atmosphere at 250° C. for one hour, and a stable film 17 having a thickness of 3 μm is obtained. Thus, as shown in FIG. 5B, the step of hardening and patterning the second sealing material film is completed.

Figure 5C:
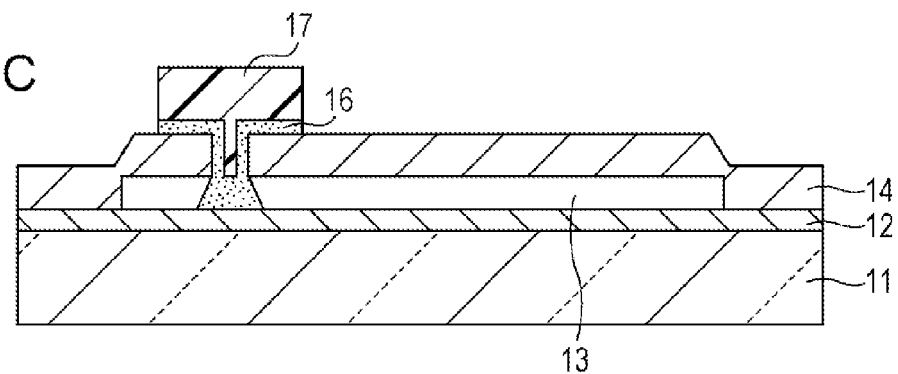
Figure 5D:
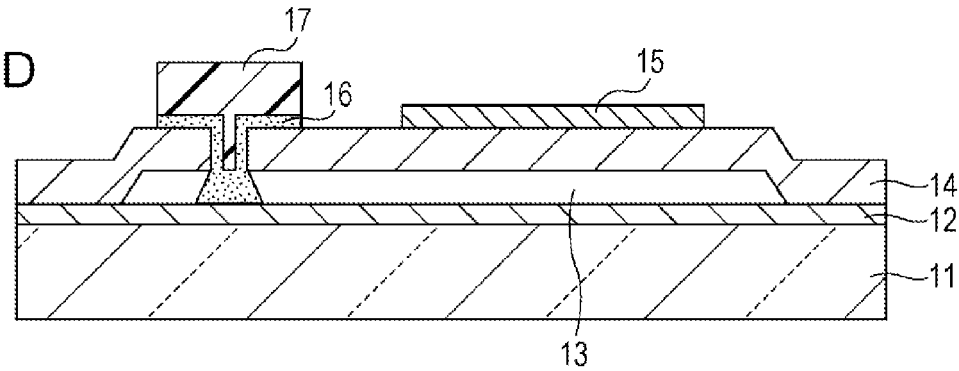

In the step shown in FIG. 5C, a sealing portion that seals the cavity is formed by pattering the first sealing material film by dry etching using the patterned second sealing material film as a mask. Here, the $SiO_2$ film 16 is etched by dry etching method, and the first sealing material 16 is left in the etching hole part. The conditions of this step can be as follows. After evacuation to $3\times10^{-5}$ Pa, etching is performed for 25 minutes under the following conditions: $CF_4$ gas flow rate of 20 sccm, pressure 5 Pa, and DC power 150 W. Thus, as shown in FIG. 5C, the etching hole part is sealed in a state where the second sealing material film 17 is superposed on the first sealing material film 16. The thickness of the second sealing material film 17 is larger than the thickness of the first sealing material film 16. Next, the step shown in FIG. 5D is performed. After evacuation to 3×10$^{-5}$ Pa, sputtering is performed for 300 seconds under the following conditions: Ar flow rate of 30 sccm, pressure 0.7 Pa, and DC power 300 W. Thus, an aluminum film about 300 nm thick is formed. After that, the aluminum film is patterned by photolithography process, and thereby an upper electrode 15 is formed.

A capacitive electromechanical transducer of this embodiment fabricated in this way was immersed in red ink for an inkjet printer. Ink did not enter the highly reliably sealed cavity 13. In addition, since the SiO$_2$ (first sealing material) film 16 and the polyimide (second sealing material) film 17 are resistant to oil, the electromechanical transducer functioned well as a sensor even after being immersed in castor oil for 1000 hours. Thus, a highly reliable capacitive electromechanical transducer was obtained.

Second Embodiment

A capacitive electromechanical transducer and a method for fabricating the same of a second embodiment will be described. In this embodiment, the same fabricating steps as those in the first embodiment are performed. However, as a first sealing material film 16, an aluminum film 600 nm thick is formed by sputtering. As a second sealing material 17, photosensitive silicone (nanohybrid silicone FX-V366, ADEKA), which is an organic material having photosensitivity, is applied using a spinner. To harden this material, a 30-minute low-temperature process at a firing temperature of 200° C. can be used as the hardening process after exposure and development. Photosensitive silicone is resistant to acid and has sufficient performance as a resist for etching aluminum of the first sealing material 16.

Third Embodiment

Figure 6A:
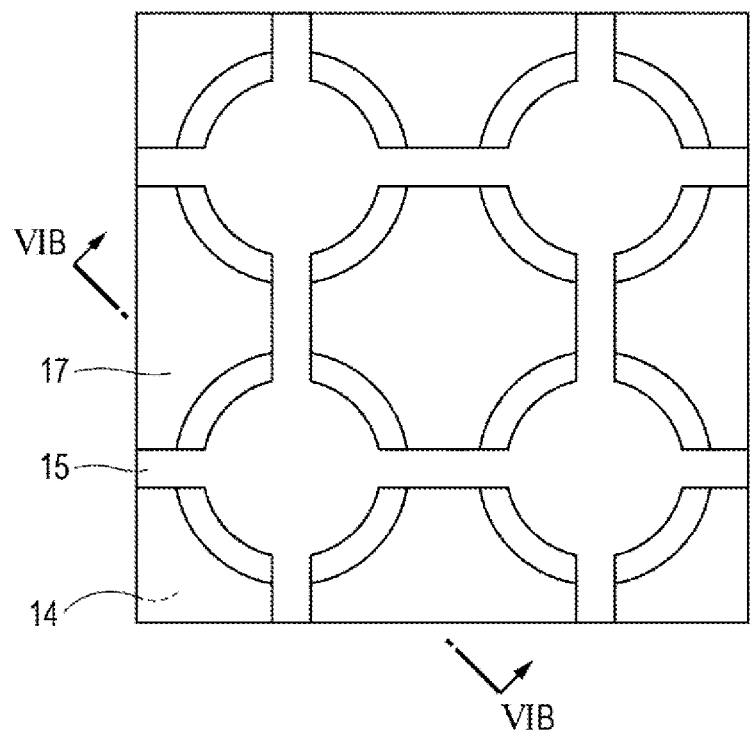
FIGS. 6A and 6B illustrate a third embodiment of the present invention.
Figure 6B:
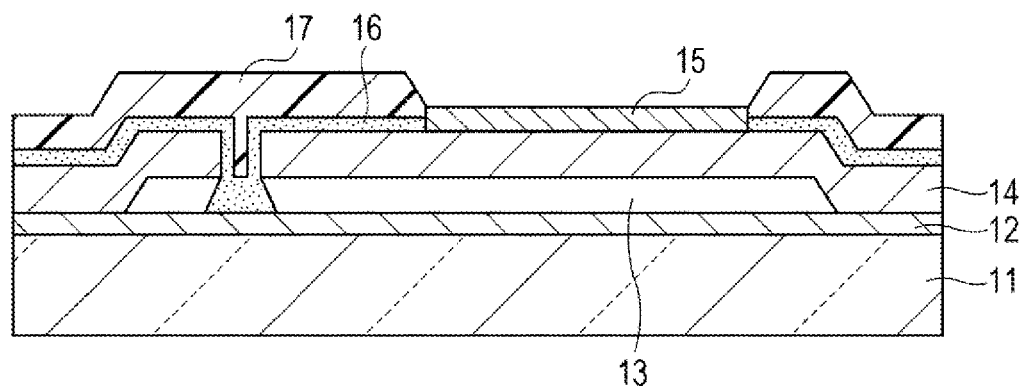

With reference to FIGS. 6A and 6B, a capacitive electromechanical transducer and a method for fabricating the same of a third embodiment will be described. FIG. 6A is a plan view, and FIG. 6B is a sectional view taken along line VIB-VIB of FIG. 6A. FIGS. 6A and 6B show the basic structure of the capacitive electromechanical transducer of this embodiment. As shown, the second sealing material 17 (and the first sealing material 16) can be left in the area other than the upper electrode 15 or other than the part just above the cavity 13. In this case, the airtightness can be further improved. In other respects, this embodiment is the same as the first embodiment.

Fourth Embodiment

Figure 7A:
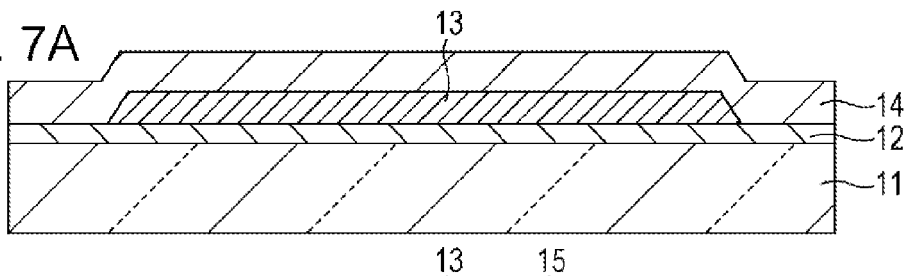
FIGS. 7A to 7F illustrate a fourth embodiment of the present invention.
Figure 7B:
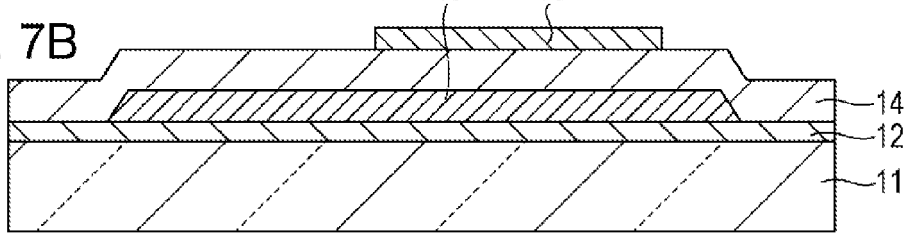
Figure 7C:
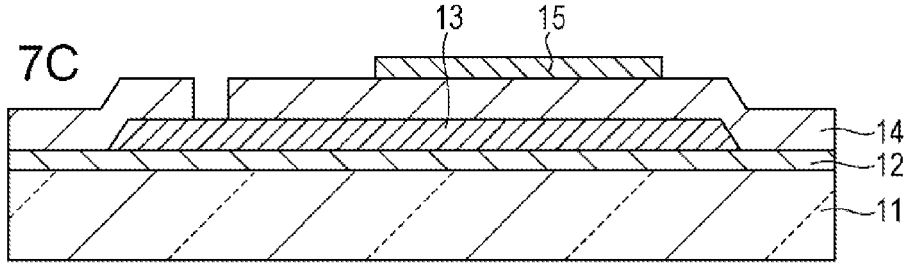
Figure 7D:
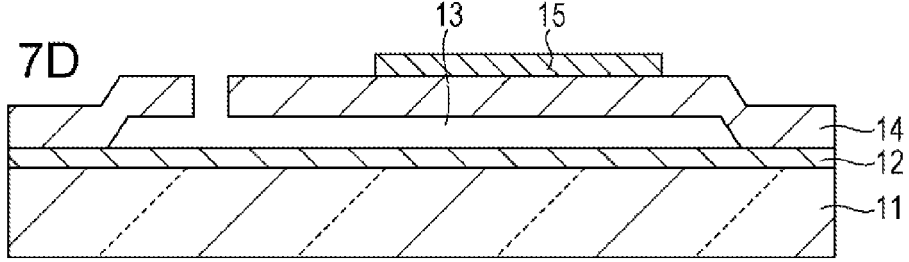
Figure 7E:
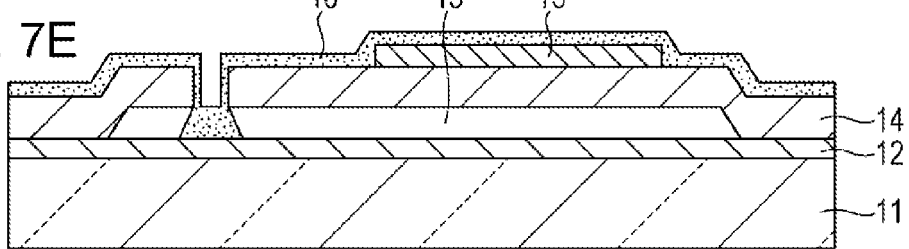
Figure 7F:
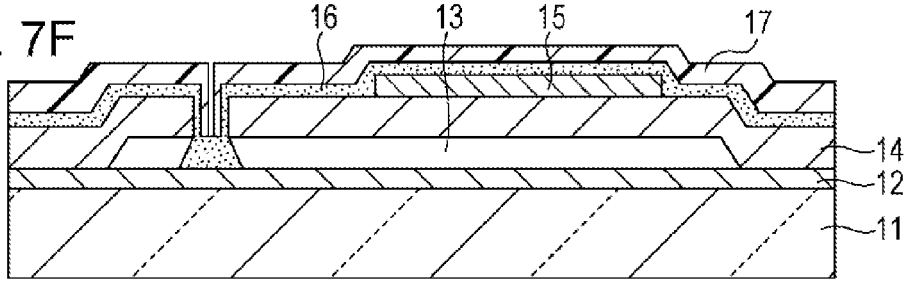

With reference to FIGS. 7A to 7F, a capacitive electromechanical transducer and a method for fabricating the same of a fourth embodiment will be described. In this embodiment, the same fabricating steps as those in the first embodiment are performed until a first vibrating membrane 14 is formed (FIG. 7A). After forming the first vibrating membrane 14, a second electrode 15 is formed (FIG. 7B). Specifically, a titanium film about 100 nm thick is formed, and then the titanium film is patterned by photolithography process. The second electrode in this embodiment can be formed of a material resistant to etchant to improve etching selectivity in the sacrifice layer removing step. After that, in the same manner as in the first embodiment, an etching hole for removing the sacrifice layer by etching is formed (FIG. 7C). By immersing in sacrifice layer removing etchant, the sacrifice layer is removed through the etching hole. By drying, the sealed cavity 13 is formed (FIG. 7D). Next, a film of a first sealing material 16 that does not have fluidity at normal temperature is formed on the vibrating membrane 14 having an etching hole (FIG. 7E). In this embodiment, the first sealing material film 16 is also formed on the vibrating membrane 14 and the second electrode 15 and serves as a second vibrating membrane. The conditions of this step can be as follows. Film formation is performed for five minutes under the following conditions: substrate temperature 350° C., RF power 935 W, chamber pressure 213 Pa, SiH$_4$ gas flow rate of 160 sccm, N$_2$ gas flow rate of 2000 sccm, and NH$_3$ gas flow rate of 127 sccm. Thus, an SiN film 16 having a thickness of about 700 nm is formed. Next, a second sealing material that has fluidity at normal temperature is applied, and a protective film for the vibrating membrane is formed (FIG. 7F). For example, PDMS is applied as a second sealing material to the electromechanical transducer in which a film of the first sealing material is formed. After that, heat hardening was performed in a heating furnace. Thus, a film of the second sealing material 17 is formed on the film of the first sealing material 16, and a protective film is formed on the second vibrating membrane. By following through with these steps, the first sealing material film 16 can be used as a part of a vibrating membrane, and the second sealing material film 17 can be used as a protective film for the vibrating membrane. Thus, an electromechanical transducer having high reliability can be provided without spoiling the sealing performance in the first embodiment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-09319 filed Apr. 23, 2010 and No. 2011-037773 filed Feb. 24, 2011, which are hereby incorporated by reference herein in their entirety.

What is claimed is:

1. A method for fabricating an electromechanical transducer including a first electromagnetic element and a second electromagnetic element disposed opposite to each other with a sealed cavity therebetween, the method comprising:
    forming a sacrifice layer on the first electromagnetic element and patterning the sacrifice layer;
    forming a vibrating membrane on the sacrifice layer;
    forming an etching hole in the vibrating membrane;
    etching the sacrifice layer through the etching hole and thereby forming the cavity;
    forming a film of a first sealing material that does not have fluidity at normal temperature on the vibrating membrane having the etching hole;
    forming a film of a second sealing material that has fluidity at normal temperature on the film of the first sealing material;
    hardening and patterning the film of the second sealing material; and
    etching the film of the first sealing material using the patterned film of the second sealing material as a mask and thereby forming a sealing portion that seals the cavity.

2. The method according to claim 1, further comprising forming the second electromagnetic element on the vibrating membrane.

3. The method according to claim 1, wherein the vibrating membrane is formed of a conductive material and functions as the second electromagnetic element.

4. The method according to claim 1, wherein the first electromagnetic element and the second electromagnetic element are a first electrode and a second electrode, respectively.

5. The method according to claim 1, wherein the second electromagnetic element is formed on a surface of the vibrating membrane above the sealed cavity opposite to the first electromagnetic element.

6. The method according to claim 1, wherein the film of the second sealing material is formed in an area other than the second electromagnetic element or other than part just above the sealed cavity.

7. The method according to claim 1, wherein the film of the hardened second sealing material is resistant to acid and oil.

8. The method according to claim 1, wherein the second sealing material is inorganic SOG, an organic material, or a photosensitive organic material.

* * * * *